US011557992B2

United States Patent
Buksh et al.

(10) Patent No.: US 11,557,992 B2
(45) Date of Patent: Jan. 17, 2023

(54) SYSTEMS AND METHODS FOR PHASE-VOLTAGE BASED MOTOR PERIOD MEASUREMENT AND CONTROLLED SIGNAL PATH FAULT DETECTION

(71) Applicant: DELPHI TECHNOLOGIES IP LIMITED, St. Michael (BB)

(72) Inventors: Raquib Buksh, Kokomo, IN (US); Kevin M. Gertiser, Carmel, IN (US); Ihab Nahlus, Indianapolis, IN (US); Tushar Nachnani, Carmel, IN (US); Ronald M. Shearer, Kokomo, IN (US); Mitchell Cohen, Carmel, IN (US); Spandana V. Barre, Kokomo, IN (US)

(73) Assignee: DELPHI TECHNOLOGIES IP LIMITED, St. Michael (BB)

( * ) Notice: Subject to any disclaimer, the term of this patent is extended or adjusted under 35 U.S.C. 154(b) by 0 days.

(21) Appl. No.: 17/321,020

(22) Filed: May 14, 2021

(65) Prior Publication Data
US 2022/0368253 A1  Nov. 17, 2022

(51) Int. Cl.
H02P 6/18  (2016.01)
H02P 21/32  (2016.01)
H02P 6/185  (2016.01)

(52) U.S. Cl.
CPC .............. H02P 6/186 (2013.01); H02P 6/185 (2013.01); H02P 21/32 (2016.02); *H02P 2203/03* (2013.01)

(58) Field of Classification Search
CPC ........... H02P 6/185; H02P 6/186; H02P 21/32
See application file for complete search history.

(56) References Cited

U.S. PATENT DOCUMENTS 5,266,891 A  11/1993 Kumar et al.
9,525,372 B2  12/2016 Hill
2022/0190690 A1*  6/2022 Taniguchi ............ H02K 11/215

FOREIGN PATENT DOCUMENTS

DE  102018200717 A1  7/2019

OTHER PUBLICATIONS

Freescale Semiconductor, 3-Phase BLDC Motor Control with Sensorless Back EMF Zero Crossing Detection Using 56F80x, Nov. 2005, Chandler, Arizona, USA.

(Continued)

*Primary Examiner* — Said Bouziane
(74) *Attorney, Agent, or Firm* — Joshua M. Haines; Bookoff McAndrews, PLLC

(57) ABSTRACT

A method for phase-voltage based motor period measurement includes generating a commanded phase voltage and applying the commanded phase voltage to a first phase voltage input of an electric motor, a second phase voltage input of the electric motor, and a third phase voltage input of the electric motor, measuring a first period of a phase voltage associated with the first phase voltage input and the second phase voltage input and comparing the measured first period to a frequency of the commanded phase voltage, and, in response to a determination that the measured first period of the phase voltage associated with the first phase voltage input and the second phase voltage input is outside of a range of the frequency associated with the commanded phase voltage, identifying a fault associated with the first integrated circuit or signal path.

20 Claims, 5 Drawing Sheets

(56) References Cited

OTHER PUBLICATIONS

Rasyadan Amir et al: "Modeling of Time Domain Analysis for Single and Double Open-Circuit Inverter Switch Faults in Three-Phase Induction Motor Drives", 2018 International Conference on Computational Approach in Smart Systems Design and Applications (ICASSDA), Aug. 15, 2018, pp. 1-7.
Extended European Search Report in EP Application No. 22171468.6 dated Oct. 25, 2022 (5 pages).

* cited by examiner

SYSTEMS AND METHODS FOR PHASE-VOLTAGE BASED MOTOR PERIOD MEASUREMENT AND CONTROLLED SIGNAL PATH FAULT DETECTION

TECHNICAL FIELD

This disclosure relates to vehicle circuits, and in particular, to systems and methods for phase-voltage based motor period measurement and controlled signal path fault detection.

BACKGROUND

Vehicles, such as cars, trucks, sport utility vehicles, crossovers, mini-vans, or other suitable vehicles, typically include various electric motors, such as permanent magnet motors or other suitable electric motors. Such electric motors may be used for various aspects of vehicle control or operation, such as vehicle prolusion or other suitable aspects of vehicle control or operation.

In a typical electric motor, application of torque requires knowledge (e.g. by a controller of the vehicle) of motor position. However, when the circuitry for obtaining the motor position is faulted, the system associated with the electric motor is placed in a safe state of operation. Typically, this may include the controller or other suitable component determining a particular safe state of operation in which to place the system associated with the electric motor. To determine the particular safe state, the controller or other suitable component typically measures a speed of the electric motor. The controller or other suitable component may then use the measured speed of the motor to determine the particular safe state of operation.

SUMMARY

This disclosure relates generally to electric motor control.

An aspect of the disclosed embodiments includes a method for phase-voltage based motor period measurement (e.g., where a period is inversely proportional to speed). The method includes generating a commanded phase voltage and applying the commanded phase voltage to a first phase voltage input of an electric motor, a second phase voltage input of the electric motor, and a third phase voltage input of the electric motor. The first phase voltage input and the second phase voltage input may be connected to a first differential capacitively coupled interface of a first integrated circuit and the second phase voltage input and the third phase voltage input may be connected to a second differential capacitively coupled interface of a second integrated circuit. The method also includes measuring, at an integrated analog comparator of the first integrated circuit, a first period of a phase voltage associated with the first phase voltage input and the second phase voltage input and comparing the first period of the phase voltage associated with the first phase voltage input and the second phase voltage input to a frequency associated with the commanded phase voltage. The method also includes, in response to a determination that the first period of the phase voltage associated with the first phase voltage input and the second phase voltage input is outside of a range of the frequency associated with the commanded phase voltage, identifying a fault associated with the first integrated circuit and/or a corresponding signal path.

Another aspect of the disclosed embodiments includes a system for phase-voltage based motor period measurement. The system includes a processor and a memory. The memory includes instructions that, when executed by the processor, cause the processor to: command generation of a phase voltage with a defined period (e.g., frequency) during a command of self-test operation; apply the commanded phase voltage to a first phase voltage input of an electric motor, a second phase voltage input of the electric motor, and a third phase voltage input of the electric motor, the first phase voltage input and the second phase voltage input being connected to a first differential capacitively coupled interface of a first integrated circuit and the second phase voltage input and the third phase voltage input being connected to a second differential capacitively coupled interface of a second integrated circuit; measure, at an integrated analog comparator of the first integrated circuit, a first period of a phase voltage associated with the first phase voltage input and the second phase voltage input; compare the first period of the phase voltage associated with the first phase voltage input and the second phase voltage input to a frequency associated with the commanded phase voltage; and, in response to a determination that the first period of the phase voltage associated with the first phase voltage input and the second phase voltage input is outside of a range of the frequency associated with the commanded phase voltage, identify a fault associated with at least one of the first integrated circuit and a corresponding signal path.

Another aspect of the disclosed embodiments includes an apparatus for phase-voltage based motor period measurement. The apparatus includes a processor and a memory. The memory includes instructions that, when executed by the processor, cause the processor to: command generation of a phase voltage with a defined period (e.g., frequency)during a power-up/initialization self-test operation; apply the commanded phase voltage to a first phase voltage input of an electric motor, a second phase voltage input of the electric motor, and a third phase voltage input of the electric motor, the first phase voltage input and the second phase voltage input being connected to a first differential capacitively coupled interface of a first integrated circuit and the second phase voltage input and the third phase voltage input being connected to a second differential capacitively coupled interface of a second integrated circuit; measure, at an integrated analog comparator of the first integrated circuit, a first period of a phase voltage associated with the first phase voltage input and the second phase voltage input; compare the first period of the phase voltage associated with the first phase voltage input and the second phase voltage input to a frequency associated with the commanded phase voltage; in response to a determination that the first period of the phase voltage associated with the first phase voltage input and the second phase voltage input is outside of a range of the frequency associated with the commanded phase voltage, identify a fault associated with at least one of the first integrated circuit and a corresponding signal path; measure, at an integrated analog comparator of the second integrated circuit, a second period of a phase voltage associated with the second phase voltage input and the third phase voltage input; compare the second period of the phase voltage associated with the second phase voltage input and the third phase voltage input to the frequency associated with the commanded phase voltage; and, in response to a determination that the second period of the phase voltage associated with the second phase voltage input and the third phase voltage input is outside of a range of the frequency associated with the commanded phase voltage, identify a fault associated with at least one of the second integrated circuit and a corresponding signal path.

These and other aspects of the present disclosure are provided in the following detailed description of the embodiments, the appended claims, and the accompanying figures.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

Figure 1:
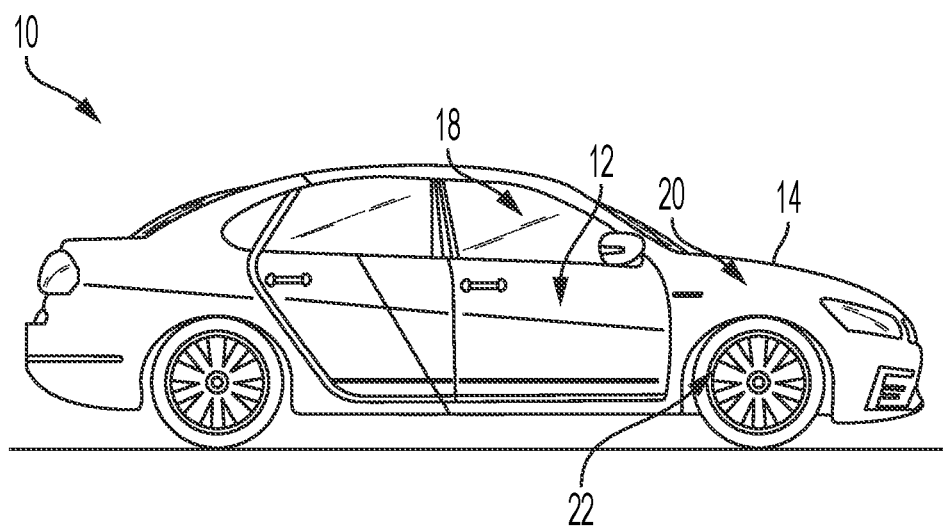
FIG. 1 generally illustrates a vehicle according to the principles of the present disclosure.

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

As described, vehicles, such as cars, trucks, sport utility vehicles, cross-overs, mini-vans, or other suitable vehicles, typically include various electric motors, such as permanent magnet motors or other suitable electric motors. Such electric motors may be used for various aspects of vehicle control or operation, such as vehicle propulsion or other suitable aspects of vehicle control or operation.

In a typical electric motor, application of torque requires knowledge (e.g. by a controller of the vehicle) of motor position. However, when the circuitry for obtaining the motor position is faulted, the system associated with the electric motor is placed in a safe state of operation. Typically, this may include the controller determining a particular safe state of operation in which to place the system associated with the electric motor. Placing the system associated with the electric motor in a safe state of operation while the vehicle is moving is typically done by the controller commanding either all six switches, while may include insulated gate bipolar transistor (IGBT) switches or other suitable switches, open (e.g., which may be referred to as six switch-open (6SO)) or by the controller commanding three upper/lower of the six IGBT switches closed (e.g., which may be referred to as a 3 phase-short upper/lower (3PSU/3PSL)).

In order to determine which safe state of operation (e.g., 6SO or 3PS) in which to place the system associated with the electric motor, the controller, typically, measures a speed of the electric motor. The controller or other suitable component may then use the measured speed of the motor to determine the particular safe state of operation. For the vehicle to operate accordingly to a respective risk classification scheme, such as the automotive safety integrity level (ASIL) D or other suitable risk classification scheme), the vehicle may, for safe state operation control of the system associated with the electric motor, include a circuit that measures the speed of the electric motor and may include the ability to test that circuit with good coverage.

Typically, solutions for providing a safe state of operation for the system associated with the electric motor may include using high voltage (HV) isolation amplifiers with HV resistor divider networks to communicate a single phase-voltage across the HV interface and to support motor speed measurement using a secondary microprocessor or controller, which may be relatively resource intensive and consume significant printed circuit board (PCB) real estate. In addition, such solutions typically do not address the lack of fault coverage diagnostics for an ASIL D compliant system. For example, such solutions: do not support testing for faults in the IGBT control and feedback path prior to enabling torque; use of a singular phase voltage feedback to monitor speed during 6SO (e.g., but not to test the continuity and integrity of the full control and feedback path for all six IGBTs during power-up/initialization self-test), monitor a single phase voltage only after entering torque/mission mode, and use single phase voltage feedback.

Such solutions may result in a loss of visibility to the phase voltage input signal, in response to a fault in the singular feedback path. Additionally, or alternatively, such solutions may not be capable of measuring speed in the 6SO operating mode and therefore may fail to keep the system associated with the electric motor in an appropriate safe state of operation.

Accordingly, systems and methods, such as those described herein, configured to provide phase-voltage based motor period measurement and controlled signal path fault detection, may be desirable. In some embodiments, the systems and the methods described herein may be configured to provide a phase-voltage based period measurement differential interface that includes HV isolation having relatively high immunity to coupled noise without the use of (relatively expensive) components. The systems and methods described herein may be configured to provide a functional safety test methodology that verifies the continuity and integrity of the complete IGBT control and feedback path using the controller and an application specific integrated circuit (ASIC) state machine.

In some embodiments, the systems and methods described herein may be configured to use a differential capacitively coupled interface, biased to mid-supply and compared to each other. The systems and methods described herein may be configured to bias and appropriately filter (e.g., using corresponding filter circuitry) the systems associated with the electric motor to reject high frequency interconnect transients and support rejection of high voltage to low voltage domain ground disturbances.

In some embodiments, the systems and methods described herein may be configured to provide relatively high tolerance to single point faults (SPF). The systems and methods described herein may be configured to use phase redundancy by routing three phases to two ASICs for period measurement. The systems and methods described herein may be configured to use a motor period detection block of a corresponding ASIC. The systems and methods described herein may be configured to command, using the controller, an alternating 3 phase short upper (3PSU) and 3 phase short lower (3PSL) pattern, at a predetermined period. The systems and methods described herein may be configured to compare the pattern to a measured period from the ASIC.

In some embodiments, the systems and methods described herein may be configured to use the controller to control switching of the external IGBTs and to measure a period within the ASIC to verify that: the six IGBT drivers are working properly; the six IGBT gate drive power supplies are working properly; the six connections of the IGBT and the path is connected properly; the period measurements are relayed to the controller properly; the six IGBTs are switching in accordance with the controller commands; the passive components are connected properly between the IGBTs and the phase voltage feedback paths; and the phase voltage based motor period detection block is operating properly.

In some embodiments, systems and methods described herein may be configured to provide a test of the system of the electric motor that is relatively easily executed and provides a relatively fast (e.g., 10 milliseconds or other suitable period) test response (e.g., of the entire path and for all IGBTs), which may enable relatively fast entry to mission mode operation. The systems and methods described herein may be configured to (e.g., using the differential interface topology, and redundant phase voltage inputs in combination with the controller and ASIC controlled test sequences) enable period measurement and fault detection, while supporting ASIL D functional safety requirements.

In some embodiments, the systems and methods described herein may be configured to provide a solution that reduces PCB area and costs. The systems and methods described herein may be configured to accommodate ground domain differential voltages (alternating current (AC) and direct current (DC)) without the need for the isolation amplifier(s). The systems and methods described herein may be configured to eliminate the use of an HV resistor divider network and a secondary microprocessor for the period measurement. The systems and methods described herein may be configured to provide a controller and ASIC controlled test strategy where the full IGBT control and feedback path is tested, which may provide a comprehensive fault coverage prior to enabling torque.

In some embodiments, the systems and methods described herein may be configured to generate a command phase voltage (e.g., by commanding the generation of the phase voltage). The systems and methods described herein may be configured to command the generation of the phase voltage during a command of a self-test operation or during any suitable operation or at any suitable time. The commanded phase voltage may include a three phase short upper and a three phase short lower pattern or other suitable pattern. The systems and methods described herein may be configured to apply the commanded phase voltage to a first phase voltage input of an electric motor, a second phase voltage input of the electric motor, and a third phase voltage input of the electric motor. The electric motor may be associated with a vehicle. However, it should be understood that the electric motor may be associated with any other suitable application in addition to or instead of the vehicle and that the principles of the present disclosure apply accordingly. The first phase voltage input and the second phase voltage input may be connected to a first differential capacitively coupled interface of a first integrated circuit and the second phase voltage input and the third phase voltage input may be connected to a second differential capacitively coupled interface of a second integrated circuit. The first integrated circuit may include a first ASIC and the second integrated circuit may include a second ASIC.

In some embodiments, the first differential capacitively coupled interface may be biased to a mid-supply and may be configured to provide a differential phase voltage input signal, based on the first phase voltage input and the second phase voltage input, to the first integrated circuit. Additionally, or alternatively, the first differential capacitively coupled interface may be configured to reject high frequency interconnect transients and to reject high voltage to low voltage domain ground disturbances.

In some embodiments, the second differential capacitively coupled interface may be biased to a mid-supply and may be configured to provide a differential phase voltage input signal, based on the second phase voltage input and third voltage input, to the second integrated circuit. Additionally, or alternatively, the second differential capacitively coupled interface may be configured to reject high frequency interconnect transients and to reject high voltage to low voltage domain ground disturbances.

The systems and methods described herein may be configured to measure, at an integrated analog comparator of the first integrated circuit, a first period of a phase voltage associated with the first phase voltage input and the second phase voltage input. The systems and methods described herein may be configured to compare the first period of the phase voltage associated with the first phase voltage input and the second phase voltage input to a frequency associated with the commanded phase voltage. The systems and methods described herein may be configured to, in response to a determination that the first period of the phase voltage associated with the first phase voltage input and the second phase voltage input is outside of a range of the frequency associated with the commanded phase voltage, identify a fault associated with at least one of the first integrated circuit and a corresponding signal path.

In some embodiments, the systems and methods described herein may be configured to measure, at an integrated analog comparator of the second integrated circuit, a second period of a phase voltage associated with the second phase voltage input and the third phase voltage input. The systems and methods described herein may be configured to compare the second period of the phase voltage associated with the second phase voltage input and the third phase voltage input to the frequency associated with the commanded phase voltage. The systems and methods described herein may be configured to, in response to a determination that the second period of the phase voltage associated with the second phase voltage input and the third phase voltage input is outside of a range of the frequency associated with the commanded phase voltage, identify a fault associated with at least one of the second integrated circuit and a corresponding signal path.

FIG. 1 generally illustrates a vehicle 10 according to the principles of the present disclosure. The vehicle 10 may include any suitable vehicle, such as a car, a truck, a sport utility vehicle, a mini-van, a cross-over, any other passenger vehicle, any suitable commercial vehicle, or any other suitable vehicle. While the vehicle 10 is illustrated as a passenger vehicle having wheels and for use on roads, the principles of the present disclosure may apply to other vehicles, such as planes, boats, trains, drones, or other suitable vehicles. The vehicle 10 includes a vehicle body 12 and a hood 14. A portion of the vehicle body 12 defines a passenger compartment 18. Another portion of the vehicle body 12 defines the engine compartment 20. The hood 14 may be moveably attached to a portion of the vehicle body 12, such that the hood 14 provides access to the engine compartment 20 when the hood 14 is in a first or open position and the hood 14 covers the engine compartment 20 when the hood 14 is in a second or closed position.

The passenger compartment 18 is disposed rearward of the engine compartment 20. The vehicle 10 may include any suitable propulsion system including an internal combustion engine, one or more electric motors (e.g., an electric vehicle), one or more fuel cells, a hybrid (e.g., a hybrid vehicle) propulsion system comprising a combination of an internal combustion engine, one or more electric motors, and/or any other suitable propulsion system. In some embodiments, the vehicle 10 may include a petrol or gasoline fuel engine, such as a spark ignition engine. In some embodiments, the vehicle 10 may include a diesel fuel engine, such as a compression ignition engine. The engine compartment 20 houses and/or encloses at least some components of the propulsion system of the vehicle 10. Additionally, or alternatively, propulsion controls, such as an accelerator actuator (e.g., an accelerator pedal), a brake actuator (e.g., a brake pedal), a steering wheel, and other such components are disposed in the passenger compartment 18 of the vehicle 10. The propulsion controls may be actuated or controlled by a driver of the vehicle 10 and may be directly connected to corresponding components of the propulsion system, such as a throttle, a brake, a vehicle axle, a vehicle transmission, and the like, respectively. In some embodiments, the propulsion controls may communicate signals to a vehicle computer (e.g., drive by wire) which in turn may control the corresponding propulsion component of the propulsion system.

In some embodiments, the vehicle 10 includes a transmission in communication with a crankshaft via a flywheel or clutch or fluid coupling. In some embodiments, the transmission includes a manual transmission. In some embodiments, the transmission includes an automatic transmission. The vehicle 10 may include one or more pistons, in the case of an internal combustion engine or a hybrid vehicle, which cooperatively operate with the crankshaft to generate force which is translated through the transmission to one or more axles which turns wheels 22. When the vehicle 10 includes one or more electric motors, a vehicle battery and/or fuel cell provides energy to the electric motors to turn the wheels 22. In cases where the vehicle 10 includes a vehicle battery to provide energy to the one or more electric motors, when the battery is depleted, it may be connected to an electric grid (e.g., using a wall socket) to recharge the battery cells. Additionally, or alternatively, the vehicle 10 may employ regenerative braking which uses the one or more electric motors of the vehicle 10 as a generator to convert kinetic energy lost due to decelerating back into stored energy in the battery.

The vehicle 10 may include automatic vehicle propulsion systems, such as a cruise control, an adaptive cruise control, automatic braking control, other automatic vehicle propulsion systems, or a combination thereof. The vehicle 10 may be an autonomous or semi-autonomous vehicle, or other suitable type of vehicle. The vehicle 10 may include additional or fewer features than those generally illustrated and/or disclosed herein.

Figure 2:
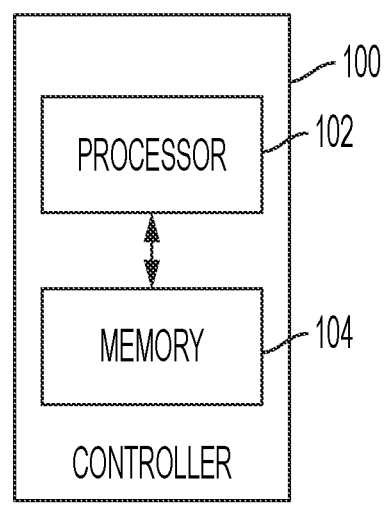
FIG. 2 generally illustrates a controller according to the principles of the present disclosure.

In some embodiments, the vehicle 10 may include a controller, such as controller 100, as is generally illustrated in FIG. 2. The controller 100 may include any suitable controller, such as an electronic control unit or other suitable controller. The controller 100 may be configured to control, for example, the various functions of the steering system and/or various functions of the vehicle 10. The controller 100 may include a processor 102 and a memory 104. The processor 102 may include any suitable processor, such as those described herein. Additionally, or alternatively, the controller 100 may include any suitable number of processors, in addition to or other than the processor 102. The memory 104 may comprise a single disk or a plurality of disks (e.g., hard drives), and includes a storage management module that manages one or more partitions within the memory 104. In some embodiments, memory 104 may include flash memory, semiconductor (solid state) memory or the like. The memory 104 may include Random Access Memory (RAM), a Read-Only Memory (ROM), or a combination thereof. The memory 104 may include instructions that, when executed by the processor 102, cause the processor 102 to, at least, control various aspects of the vehicle 10.

In some embodiments, the controller 100 may be configured to provide phase-voltage based motor period measurement and controlled signal path fault detection. For examiner, the controller 100 may interact with and/or control aspects of a circuit 200. The circuit 200 may include a first differential capacitively coupled interface 202 (e.g., which may be referred to herein as the first interface 202) and a second differential capacitively coupled interface 204 (e.g., which may be referred to herein as the second interface 204). The first interface 202 may be biased to mid-supply. The first interface 202 may include internal and/or external filtering blocks. The second interface 204 may be biased to mid-supply. The second interface 204 may include internal and/or external filtering blocks. Each of the first interface 202 and the second interface 204 may include various electrical components, such as capacitors, resistors, inductors, and the like. The first interface 202 and the second interface 204 may be in electrical communication with one or more power supply. The controller 100 may use one or more power supplies.

In some embodiments, the first interface 202 may be configured to provide a differential phase voltage input signal to a first integrated circuit 206. Additionally, or alternatively, the second interface 204 may be configured to provide a differential phase voltage input signal to a second integrated circuit 208. The differential phase voltage input signal interface may provide relatively high noise immunity.

In some embodiments, the circuit 200 may include an inverter system that routes phase voltage inputs of an electric motor 210 to the first integrated circuit 206 and the second integrated circuit 208, respectively. For example, the inverter system may route a first phase voltage input (e.g., illustrated as VOL_PH1) and a second phase voltage input (e.g., illustrated as VOL_PH2_1) to the first integrated circuit 206. Additionally, or alternatively, the inverter system may route the second phase voltage input (e.g., illustrated as VOL_PH2_2) and a third phase voltage input (e.g., illustrated as VOL_PH3) to the second integrated circuit 208. It should be understood that the inverter may route any combination of the first phase voltage input, the second phase voltage input, and the third phase voltage input to either of the first integrated circuit 206 and the second integrated circuit 208.

In some embodiments, each of the first integrated circuit 206 and the second integrated circuit 208 may use different pairs of phase voltage inputs to ensure redundancy in the measurement of period of the motor 210 during 6SO, which may provide enhanced tolerance to single point faults.

Figure 3A:
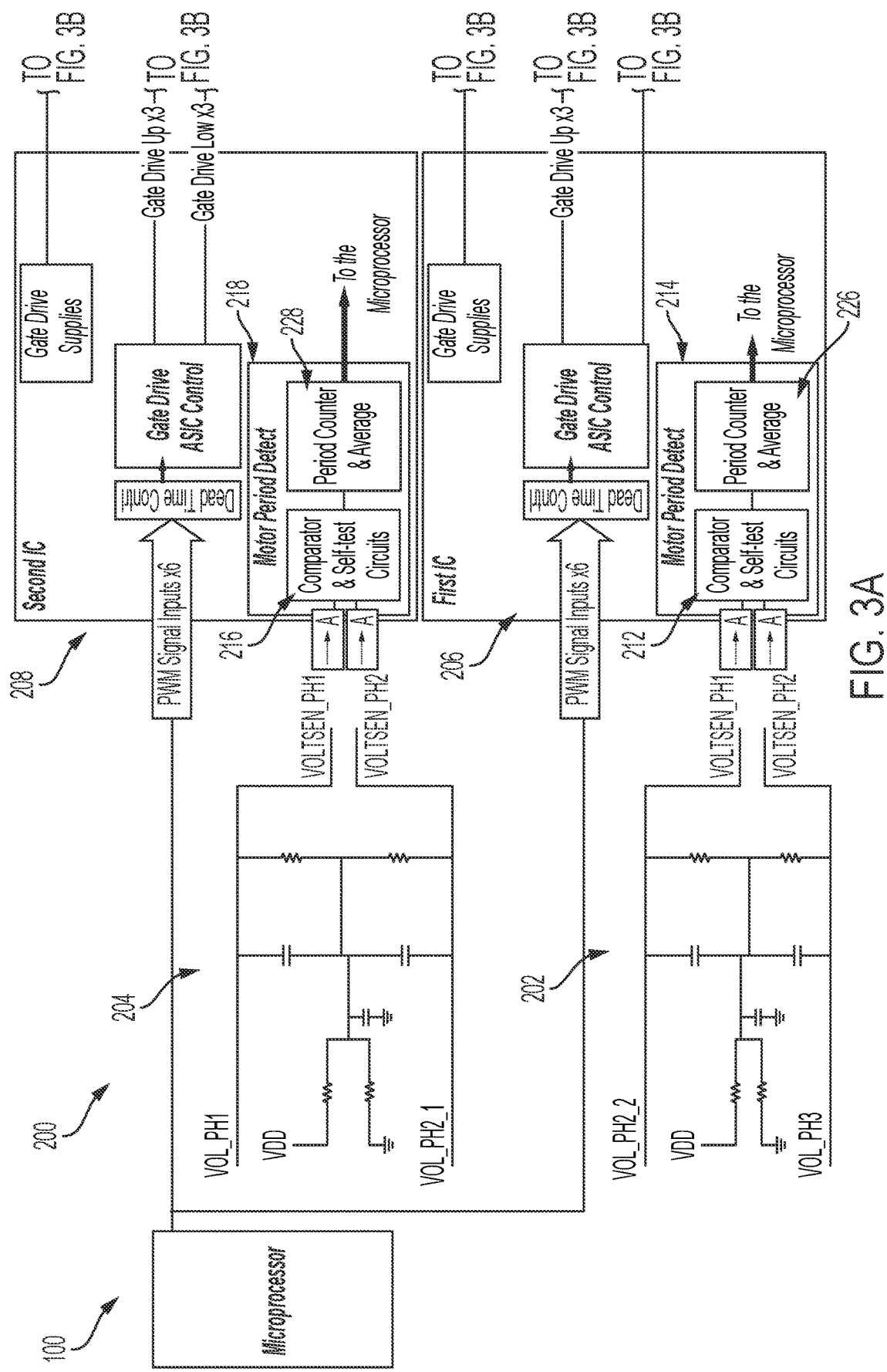
FIGS. 3A and 3B generally illustrate a phase-voltage based motor period measurement system according to the principles of the present disclosure.
Figure 3B:
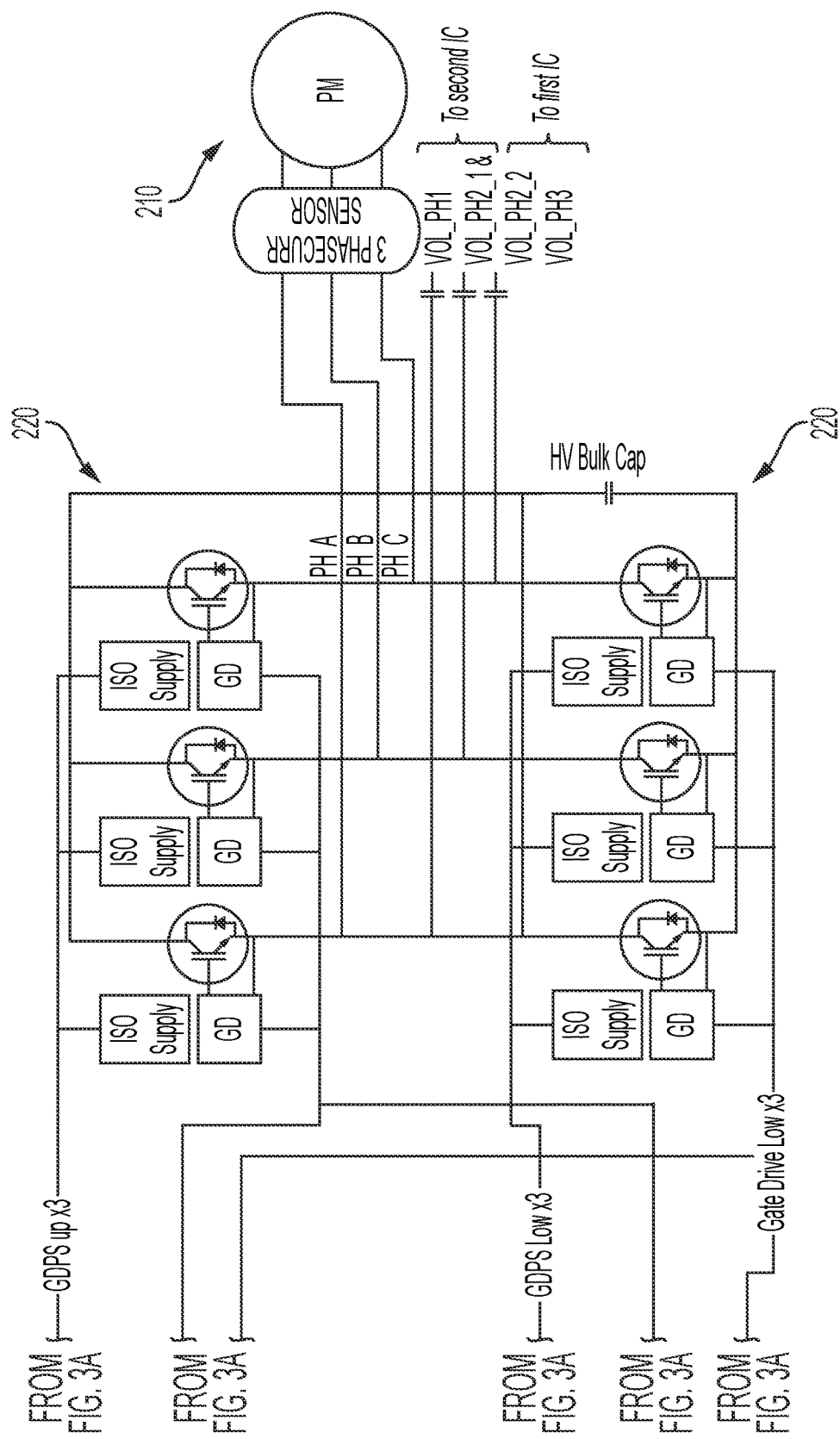

In some embodiments, the controller 100 and/or the circuit 200 may be configured to test and verify whether the complete IGBT control (e.g., include all six IGBT switches 220) and feedback signal path (as is generally illustrated in FIGS. 3A and 3B) is connected and functioning according to various operating specifications. For example, the controller 100 may, during power-up/initialization self-test operation (e.g., or other suitable operation), command a 3PSU and a 3PSL at a predetermined frequency. The frequency may include any suitable frequency including, but not limited to, a frequency up to 20 kilohertz. In some embodiments, the frequency may include a 10 kilohertz frequency or other suitable frequency.

In some embodiments, an integrated analog comparator and self-test block 212 of the first integrated circuit 206 may alternatingly monitor one of the phase voltage inputs (e.g., the first phase voltage input and the second phase voltage input) and compare the monitored phase voltage input to the mid-supply. A digital bock 214 may measure a period associated with the monitored phase voltage input. Additionally, or alternatively, an integrated analog comparator and self-test block 216 of the second integrated circuit 208 may alternatingly monitor one of the phase voltage inputs (e.g., the second phase voltage input and the third phase voltage input) and compare the monitored phase voltage input to the mid-supply. A digital bock 218 may measure a period associated with the monitored phase voltage input. This may provide testability of both phase voltage signal paths for each of the first integrated circuit 206 and the second integrated circuit 208 (e.g., all three phase voltage input signal paths in the circuit 200) with execution of a single test.

In some embodiments, the controller 100 may read the measured period via a serial peripheral interface (SPI) or other suitable interface. The controller 100 may compare the measured period to the frequency associated with the commanded frequency.

In some embodiments, a state machine associated with the circuit 200 may manage the test process. In some embodiments, controller 100 and/or the circuit 200 may support rejection of high voltage to low voltage domain ground disturbances. The controller 100 and/or the circuit 200 may increase fault coverage of the phases of the motor 210 (e.g., the first integrated circuit 206 and the second integrated circuit 208 cover all three phases).

In some embodiments, the first integrated circuit 206 may include an integrated secondary period counter and average bock 226 that provides a measurement of the average motor period over a user selectable number of readings. The controller 100 may use the average motor period as the measured period to compare to the commanded frequency to identify faults in the first integrated circuit 206.

In some embodiments, the second integrated circuit 208 may include an integrated secondary period counter and average block 228 that provides a measurement of the average motor period over a user selectable number of readings. The controller 100 may use the average motor period as the measured period to compare to the commanded frequency to identify faults in the second integrated circuit 208.

In some embodiments, the controller 100 may be configured to command generation of a phase voltage. The controller 100 may generate the commanded phase voltage during a power-up/initialization self-test operation of the circuit 200 or other suitable component of the vehicle 10. Additionally, or alternatively, the controller 100 may generate the commanded phase voltage during any suitable operation or at any suitable time. The commanded phase voltage may include a three phase short upper and a three phase short lower pattern or other suitable pattern.

The controller 100 may apply the commanded phase voltage to the first phase voltage input of the motor 210 (e.g., which may be referred to as an electric motor), the second phase voltage input of the motor 210, and the third phase voltage input of the motor 210. As described, the motor 210 may be associated with the vehicle 10. However, it should be understood that the motor 210 may be associated with any other suitable application in addition to or instead of the vehicle 10 and that the principles of the present disclosure apply accordingly.

As described, the first phase voltage input and the second phase voltage input may be connected to the first interface 202 and the second phase voltage input and the third phase voltage input may be connected to the second interface 204. The first interface 202 may be biased to a mid-supply and may be configured to provide the differential phase voltage input signal, based on the first phase voltage input and the second phase voltage input, to the first integrated circuit 206. Additionally, or alternatively, the first interface 202 may be configured to reject high frequency interconnect transients and to reject high voltage to low voltage domain ground disturbances.

In some embodiments, the second interface 204 may be biased to a mid-supply and may be configured to provide the differential phase voltage input signal, based on the second phase voltage input and third voltage input, to the second integrated circuit 208. Additionally, or alternatively, the second interface 204 may be configured to reject high frequency interconnect transients and to reject high voltage to low voltage domain ground disturbances.

The controller 100 may measure, at the integrated analog comparator and self-test block 212 of the first integrated circuit 206, a first period of a phase voltage associated with the first phase voltage input and the second phase voltage input. The controller 100 may compare the first period of the phase voltage associated with the first phase voltage input and the second phase voltage input to the frequency associated with the commanded phase voltage. The controller 100 may determine whether the first period is within a range of the commanded frequency. The range may be any suitable range, such as plus or minus 1% or plus or minus one unit of measurement of the commanded frequency, or other suitable range.

If the controller 100 determines that the first period is outside of the range of the commanded frequency, the controller 100 may identify a fault associated with the first integrated circuit 206 and/or a corresponding signal path. For example, the controller 100 may determine that a fault occurred in the first integrated circuit 206 and may identify the fault or the faulty component based on the comparison of the first period and the commanded frequency. The controller 100 may place the circuit 200 in a safe state of operation, such as any of the safe states of operation described herein, in response to a determination that a fault occurred in the first integrated circuit 206. Alternatively, if the controller 100 determines that the first period is within the range of the commanded frequency, the controller 100 determines that the first integrated circuit 206 is not faulty.

In some embodiments, the controller 100 may measure, at the integrated analog comparator and self-test block 216 of the second integrated circuit 208, a second period of a phase voltage associated with the second phase voltage input and the third phase voltage input. The controller 100 may compare the second period of the phase voltage associated with the second phase voltage input and the third phase voltage input to the frequency associated with the commanded phase voltage. The controller 100 may determine whether the second period is within the range of the commanded frequency.

If the controller 100 determines that the second period is outside of the range of the commanded frequency, the controller 100 may identify a fault associated with the second integrated circuit 208 and/or a corresponding signal path. For example, the controller 100 may determine that a fault occurred in the second integrated circuit 208 and may identify the fault or the faulty component based on the comparing between the second period and the commanded frequency. The controller 100 may place the circuit 200 in a safe state of operation, such as any of the safe states of operation described herein, in response to a determination that a fault occurred in the second integrated circuit 208. Alternatively, if the controller 100 determines that the second period is within the range of the commanded frequency, the controller 100 determines that the second integrated circuit 208 and/or the corresponding signal path is not faulty.

In some embodiments, the controller 100 and/or the circuit 200 may perform the methods described herein. However, the methods described herein as performed by the controller 100 and/or the circuit 200 are not meant to be limiting, and any type of software executed on a controller or processor can perform the methods described herein without departing from the scope of this disclosure. For example, a controller, such as a processor executing software within a computing device, can perform the methods described herein.

Figure 4:
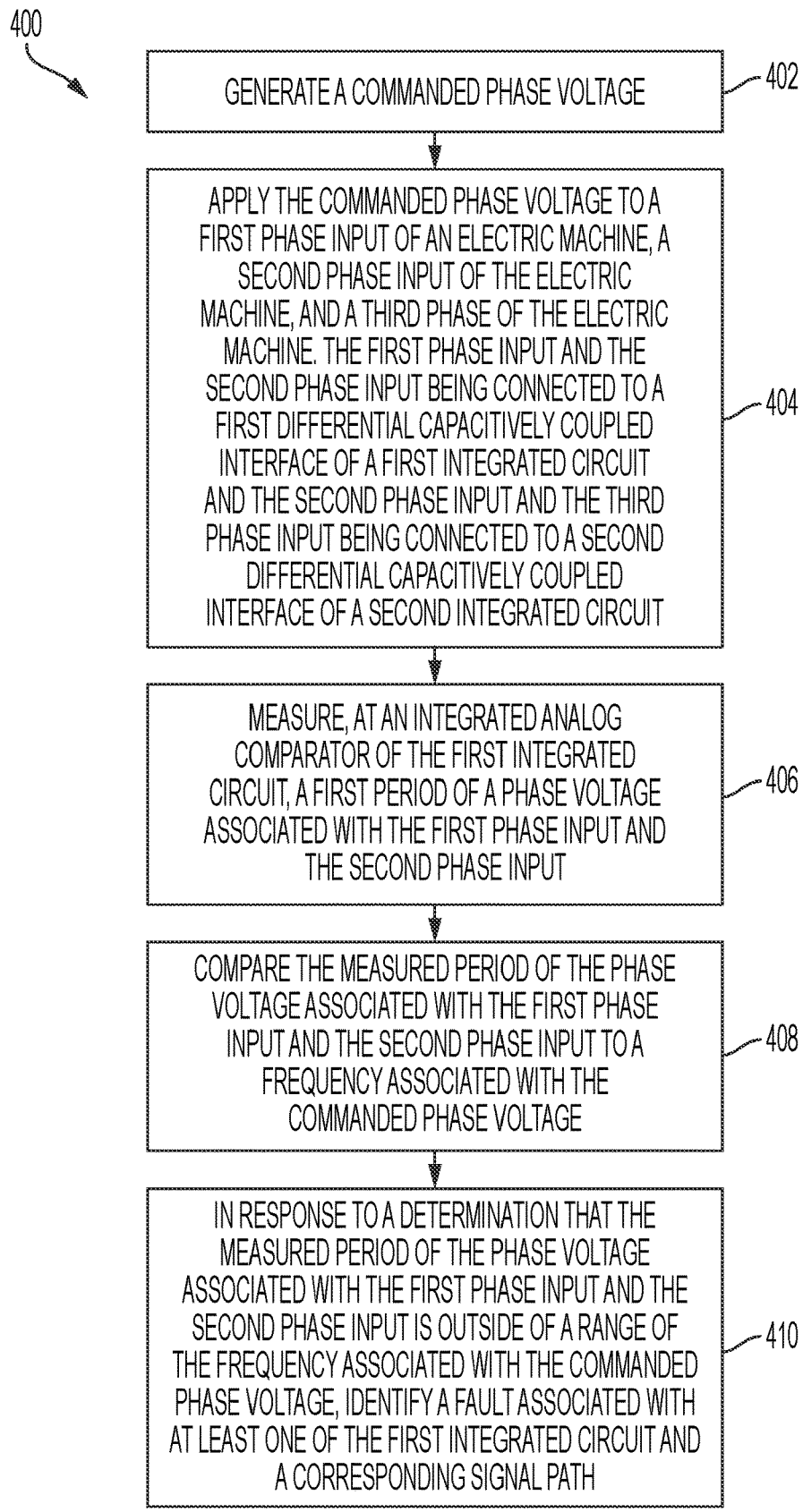
FIG. 4 is a flow diagram generally illustrating a phase-voltage based motor period measurement method according to the principles of the present disclosure.

FIG. 4 is a flow diagram generally illustrating a phase-voltage based motor period measurement method 400 according to the principles of the present disclosure. At 402, the method 400 generates a commanded phase voltage. For example, the controller 100 may generate the commanded phase voltage.

At 404, the method 400 applies the commanded phase voltage to a first phase voltage input of an electric motor, a second phase voltage input of the electric motor, and a third phase voltage input of the electric motor. The first phase voltage input and the second phase voltage input may be connected to a first differential capacitively coupled interface of a first integrated circuit and the second phase voltage input and the third phase voltage input may be connected to a second differential capacitively coupled interface of a second integrated circuit. For example, the controller 100 may apply the commanded phase voltages to the first phase voltage input, the second phase voltage input, and the third phase voltage input.

At 406, the method 400 measures, at an integrated analog comparator of the first integrated circuit, a first period of a phase voltage associated with the first phase voltage input and the second phase voltage input. For example, the integrated analog comparator and self-test block 212 of the first integrated circuit 206 may measure the first period.

At 408, the method 400 compares the first period of the phase voltage associated with the first phase voltage input and the second phase voltage input to a frequency associated with the commanded phase voltage. For example, the controller 100 may compare the first period to the commanded frequency.

At 410, the method 400, in response to a determination that the first period of the phase voltage associated with the first phase voltage input and the second phase voltage input is outside of a range of the frequency associated with the commanded phase voltage, identifies a fault associated with the first integrated circuit. For example, the controller, in response to a determination that the first period is outside of the range of the commanded frequency, identifies a fault in the first integrated circuit 206 and/or the corresponding signal path. The controller 100 may identify faults in the second integrated circuit 208 and/or the corresponding signal path, as described.

In some embodiments, a method for phase-voltage based motor period measurement includes generating a commanded phase voltage and applying the commanded phase voltage to a first phase voltage input of an electric motor, a second phase voltage input of the electric motor, and a third phase voltage input of the electric motor. The first phase voltage input and the second phase voltage input may be connected to a first differential capacitively coupled interface of a first integrated circuit and the second phase voltage input and the third phase voltage input may be connected to a second differential capacitively coupled interface of a second integrated circuit. The method also includes measuring, at an integrated analog comparator of the first integrated circuit, a first period of a phase voltage associated with the first phase voltage input and the second phase voltage input and comparing the first period of the phase voltage associated with the first phase voltage input and the second phase voltage input to a frequency associated with the commanded phase voltage. The method also includes, in response to a determination that the first period of the phase voltage associated with the first phase voltage input and the second phase voltage input is outside of a range of the frequency associated with the commanded phase voltage, identifying a fault associated with at least one of the first integrated circuit and a corresponding signal path.

In some embodiments, the method also includes measuring, at an integrated analog comparator of the second integrated circuit, a second period of a phase voltage associated with the second phase voltage input and the third phase voltage input, comparing the second period of the phase voltage associated with the second phase voltage input and the third phase voltage input to the frequency associated with the commanded phase voltage, and, in response to a determination that the second period of the phase voltage associated with the second phase voltage input and the third phase voltage input is outside of a range of the frequency associated with the commanded phase voltage, identifying a fault associated with at least one of the second integrated circuit and a corresponding signal path. In some embodiments, the first differential capacitively coupled interface is biased to a mid-supply, and the first differential capacitively coupled interface is configured to provide a differential phase voltage input signal, based on the first phase voltage input and the second phase voltage input, to the first integrated circuit. In some embodiments, the first differential capacitively coupled interface is further configured to reject high frequency interconnect transients, and reject high voltage to low voltage domain ground disturbances. In some embodiments, the second differential capacitively coupled interface is biased to a mid-supply, and the second differential capacitively coupled interface is configured to provide a differential phase voltage input signal, based on the second phase voltage input and third voltage input, to the second integrated circuit. In some embodiments, the second differential capacitively coupled interface is further configured to reject high frequency interconnect transients and reject high voltage to low voltage domain ground disturbances. In some embodiments, the electric motor is associated with a vehicle. In some embodiments, generating the commanded phase voltage includes generating the commanded phase voltage during a command of a self-test operation. In some embodiments, the commanded phase voltage includes a three phase short upper and a three phase short lower pattern. In some embodiments, the first integrated circuit includes a first application specific integrated circuit and wherein the second integrated circuit includes a second application specific integrated circuit.

In some embodiments, a system for phase-voltage based motor period measurement includes a processor and a memory. The memory includes instructions that, when executed by the processor, cause the processor to: generate a commanded phase voltage; apply the commanded phase voltage to a first phase voltage input of an electric motor, a second phase voltage input of the electric motor, and a third phase voltage input of the electric motor, the first phase voltage input and the second phase voltage input being connected to a first differential capacitively coupled interface of a first integrated circuit and the second phase voltage input and the third phase voltage input being connected to a second differential capacitively coupled interface of a second integrated circuit; measure, at an integrated analog comparator of the first integrated circuit, a first period of a phase voltage associated with the first phase voltage input and the second phase voltage input; compare the first period of the phase voltage associated with the first phase voltage input and the second phase voltage input to a frequency associated with the commanded phase voltage; and, in response to a determination that the first period of the phase voltage associated with the first phase voltage input and the second phase voltage input is outside of a range of the frequency associated with the commanded phase voltage, identify a fault associated with at least one of the first integrated circuit and a corresponding signal path.

In some embodiments, the instructions further cause the processor to measure, at an integrated analog comparator of the second integrated circuit, a second period of a phase voltage associated with the second phase voltage input and the third phase voltage input, compare the second period of the phase voltage associated with the second phase voltage input and the third phase voltage input to the frequency associated with the commanded phase voltage, and, in response to a determination that the second period of the phase voltage associated with the second phase voltage input and the third phase voltage input is outside of a range of the frequency associated with the commanded phase voltage, identify a fault associated with at least one of the second integrated circuit and a corresponding signal path. In some embodiments, the first differential capacitively coupled interface is biased to a mid-supply, and wherein the first differential capacitively coupled interface is configured to provide a differential phase voltage input signal, based on the first phase voltage input and the second phase voltage input, to the first integrated circuit. In some embodiments, the first differential capacitively coupled interface is further configured to reject high frequency interconnect transients and reject high voltage to low voltage domain ground disturbances. In some embodiments, the second differential capacitively coupled interface is biased to a mid-supply, and the second differential capacitively coupled interface is configured to provide a differential phase voltage input signal, based on the second phase voltage input and third voltage input, to the second integrated circuit. In some embodiments, the second differential capacitively coupled interface is further configured to reject high frequency interconnect transients and reject high voltage to low voltage domain ground disturbances. In some embodiments, the electric motor is associated with a vehicle. In some embodiments, wherein the instructions further cause the processor to generate the commanded phase voltage during a command of a self-test operation. In some embodiments, the commanded phase voltage includes a three phase short upper and a three phase short lower pattern.

In some embodiments, an apparatus for phase-voltage based motor period measurement. The apparatus includes a processor and a memory. The memory includes instructions that, when executed by the processor, cause the processor to: generate, during a command of a self-test operation, a commanded phase voltage; apply the commanded phase voltage to a first phase voltage input of an electric motor, a second phase voltage input of the electric motor, and a third phase voltage input of the electric motor, the first phase voltage input and the second phase voltage input being connected to a first differential capacitively coupled interface of a first integrated circuit and the second phase voltage input and the third phase voltage input being connected to a second differential capacitively coupled interface of a second integrated circuit; measure, at an integrated analog comparator of the first integrated circuit, a first period of a phase voltage associated with the first phase voltage input and the second phase voltage input; compare the first period of the phase voltage associated with the first phase voltage input and the second phase voltage input to a frequency associated with the commanded phase voltage; in response to a determination that the first period of the phase voltage associated with the first phase voltage input and the second phase voltage input is outside of a range of the frequency associated with the commanded phase voltage, identify a fault associated with at least one of the first integrated circuit and a corresponding signal path; measure, at an integrated analog comparator of the second integrated circuit, a second period of a phase voltage associated with the second phase voltage input and the third phase voltage input; compare the second period of the phase voltage associated with the second phase voltage input and the third phase voltage input to the frequency associated with the commanded phase voltage; and, in response to a determination that the second period of the phase voltage associated with the second phase voltage input and the third phase voltage input is outside of a range of the frequency associated with the commanded phase voltage, identify a fault associated with at least one of the second integrated circuit and a corresponding signal path.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

The word "example" is used herein to mean serving as an example, instance, or illustration. Any aspect or design described herein as "example" is not necessarily to be construed as preferred or advantageous over other aspects or designs. Rather, use of the word "example" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an implementation" or "one implementation" throughout is not intended to mean the same embodiment or implementation unless described as such.

Implementations of the systems, algorithms, methods, instructions, etc., described herein can be realized in hardware, software, or any combination thereof. The hardware can include, for example, computers, intellectual property (IP) cores, application-specific integrated circuits (ASICs), programmable logic arrays, optical processors, programmable logic controllers, microcode, microcontrollers, servers, microprocessors, digital signal processors, or any other suitable circuit. In the claims, the term "processor" should be understood as encompassing any of the foregoing hardware, either singly or in combination. The terms "signal" and "data" are used interchangeably.

As used herein, the term module can include a packaged functional hardware unit designed for use with other components, a set of instructions executable by a controller (e.g., a processor executing software or firmware), processing circuitry configured to perform a particular function, and a self-contained hardware or software component that interfaces with a larger system. For example, a module can include an application specific integrated circuit (ASIC), a Field Programmable Gate Array (FPGA), a circuit, digital logic circuit, an analog circuit, a combination of discrete circuits, gates, and other types of hardware or combination thereof. In other embodiments, a module can include memory that stores instructions executable by a controller to implement a feature of the module.

Further, in one aspect, for example, systems described herein can be implemented using a general-purpose computer or general-purpose processor with a computer program that, when executed, carries out any of the respective methods, algorithms, and/or instructions described herein. In addition, or alternatively, for example, a special purpose computer/processor can be utilized which can contain other hardware for carrying out any of the methods, algorithms, or instructions described herein.

Further, all or a portion of implementations of the present disclosure can take the form of a computer program product accessible from, for example, a computer-usable or computer-readable medium. A computer-usable or computer-readable medium can be any device that can, for example, tangibly contain, store, communicate, or transport the program for use by or in connection with any processor. The medium can be, for example, an electronic, magnetic, optical, electromagnetic, or a semiconductor device. Other suitable mediums are also available.

The above-described embodiments, implementations, and aspects have been described to allow easy understanding of the present disclosure and do not limit the present disclosure. On the contrary, the disclosure is intended to cover various modifications and equivalent arrangements included within the scope of the appended claims, which scope is to be accorded the broadest interpretation to encompass all such modifications and equivalent structure as is permitted under the law.

What is claimed is:

1. A method for phase-voltage based motor period measurement, the method comprising:
    generating a commanded phase voltage;
    applying the commanded phase voltage to a first phase voltage input of an electric motor, a second phase voltage input of the electric motor, and a third phase voltage input of the electric motor, the first phase voltage input and the second phase voltage input being connected to a first differential capacitively coupled interface of a first integrated circuit and the second phase voltage input and the third phase voltage input being connected to a second differential capacitively coupled interface of a second integrated circuit;
    measuring, at an integrated analog comparator of the first integrated circuit, a first period of a phase voltage associated with the first phase voltage input and the second phase voltage input;
    comparing the first period of the phase voltage associated with the first phase voltage input and the second phase voltage input to a frequency associated with the commanded phase voltage; and
    in response to a determination that the first period of the phase voltage associated with the first phase voltage input and the second phase voltage input is outside of a range of the frequency associated with the commanded phase voltage, identifying a fault associated with the at least one of the first integrated circuit and a corresponding signal path.

2. The method of claim 1, further comprising:
    measuring, at an integrated analog comparator of the second integrated circuit, a second period of a phase voltage associated with the second phase voltage input and the third phase voltage input;
    comparing the second period of the phase voltage associated with the second phase voltage input and the third phase voltage input to the frequency associated with the commanded phase voltage; and
    in response to a determination that the second period of the phase voltage associated with the second phase voltage input and the third phase voltage input is outside of a range of the frequency associated with the commanded phase voltage, identifying a fault associated with at least one of the second integrated circuit and a corresponding signal path.

3. The method of claim 1, wherein the first differential capacitively coupled interface is biased to a mid-supply, and wherein the first differential capacitively coupled interface is configured to provide a differential phase voltage input signal, based on the first phase voltage input and the second phase voltage input, to the first integrated circuit.

4. The method of claim 3, wherein the first differential capacitively coupled interface is further configured to:
    reject high frequency interconnect transients; and
    reject high voltage to low voltage domain ground disturbances.

5. The method of claim 1, wherein the second differential capacitively coupled interface is biased to a mid-supply, and wherein the second differential capacitively coupled interface is configured to provide a differential phase voltage input signal, based on the second phase voltage input and third voltage input, to the second integrated circuit.

6. The method of claim 5, wherein the second differential capacitively coupled interface is further configured to:
    reject high frequency interconnect transients; and
    reject high voltage to low voltage domain ground disturbances.

7. The method of claim 1, wherein the electric motor is associated with a vehicle.

8. The method of claim 1, wherein generating the commanded phase voltage includes generating the commanded phase voltage during a command of a self-test operation.

9. The method of claim 1, wherein the commanded phase voltage includes a three phase short upper and a three phase short lower pattern.

10. The method of claim 1, wherein the first integrated circuit includes a first application specific integrated circuit and wherein the second integrated circuit includes a second application specific integrated circuit.

11. A system for phase-voltage based motor period measurement, the system comprising:
a processor; and
a memory including instructions that, when executed by the processor, cause the processor to:
generate a commanded phase voltage;
apply the commanded phase voltage to a first phase voltage input of an electric motor, a second phase voltage input of the electric motor, and a third phase voltage input of the electric motor, the first phase voltage input and the second phase voltage input being connected to a first differential capacitively coupled interface of a first integrated circuit and the second phase voltage input and the third phase voltage input being connected to a second differential capacitively coupled interface of a second integrated circuit;
measure, at an integrated analog comparator of the first integrated circuit, a first period of a phase voltage associated with the first phase voltage input and the second phase voltage input;
compare the first period of the phase voltage associated with the first phase voltage input and the second phase voltage input to a frequency associated with the commanded phase voltage; and
in response to a determination that the first period of the phase voltage associated with the first phase voltage input and the second phase voltage input is outside of a range of the frequency associated with the commanded phase voltage, identify a fault associated with at least one of the first integrated circuit and a corresponding signal path.

12. The system of claim 11, wherein the instructions further cause the processor to:
measure, at an integrated analog comparator of the second integrated circuit, a second period of a phase voltage associated with the second phase voltage input and the third phase voltage input;
compare the second period of the phase voltage associated with the second phase voltage input and the third phase voltage input to the frequency associated with the commanded phase voltage; and
in response to a determination that the second period of the phase voltage associated with the second phase voltage input and the third phase voltage input is outside of a range of the frequency associated with the commanded phase voltage, identify a fault associated with at least one of the second integrated circuit and a corresponding signal path.

13. The system of claim 11, wherein the first differential capacitively coupled interface is biased to a mid-supply, and wherein the first differential capacitively coupled interface is configured to provide a differential phase voltage input signal, based on the first phase voltage input and the second phase voltage input, to the first integrated circuit.

14. The system of claim 13, wherein the first differential capacitively coupled interface is further configured to:
reject high frequency interconnect transients; and
reject high voltage to low voltage domain ground disturbances.

15. The system of claim 11, wherein the second differential capacitively coupled interface is biased to a mid-supply, and wherein the second differential capacitively coupled interface is configured to provide a differential phase voltage input signal, based on the second phase voltage input and third voltage input, to the second integrated circuit.

16. The system of claim 15, wherein the second differential capacitively coupled interface is further configured to:
reject high frequency interconnect transients; and
reject high voltage to low voltage domain ground disturbances.

17. The system of claim 11, wherein the electric motor is associated with a vehicle.

18. The system of claim 11, wherein the instructions further cause the processor to generate the commanded phase voltage during a command of a self-test operation.

19. The system of claim 11, wherein the commanded phase voltage includes a three phase short upper and a three phase short lower pattern.

20. An apparatus for phase-voltage based motor period measurement, the apparatus comprising:
a processor; and
a memory including instructions that, when executed by the processor, cause the processor to:
generate, during a command of a self-test operation, a commanded phase voltage;
apply the commanded phase voltage to a first phase voltage input of an electric motor, a second phase voltage input of the electric motor, and a third phase voltage input of the electric motor, the first phase voltage input and the second phase voltage input being connected to a first differential capacitively coupled interface of a first integrated circuit and the second phase voltage input and the third phase voltage input being connected to a second differential capacitively coupled interface of a second integrated circuit;
measure, at an integrated analog comparator of the first integrated circuit, a first period of a phase voltage associated with the first phase voltage input and the second phase voltage input;
compare the first period of the phase voltage associated with the first phase voltage input and the second phase voltage input to a frequency associated with the commanded phase voltage;
in response to a determination that the first period of the phase voltage associated with the first phase voltage input and the second phase voltage input is outside of a range of the frequency associated with the commanded phase voltage, identify a fault associated with at least one of the first integrated circuit and a corresponding signal path;
measure, at an integrated analog comparator of the second integrated circuit, a second period of a phase voltage associated with the second phase voltage input and the third phase voltage input;
compare the second period of the phase voltage associated with the second phase voltage input and the third phase voltage input to the frequency associated with the commanded phase voltage; and
in response to a determination that the second period of the phase voltage associated with the second phase voltage input and the third phase voltage input is outside of a range of the frequency associated with the commanded phase voltage, identify a fault associated with at least one of the second integrated circuit and a corresponding signal path.

* * * * *

UNITED STATES PATENT AND TRADEMARK OFFICE
CERTIFICATE OF CORRECTION

PATENT NO. : 11,557,992 B2
APPLICATION NO. : 17/321020
DATED : January 17, 2023
INVENTOR(S) : Raquib Buksh et al.

It is certified that error appears in the above-identified patent and that said Letters Patent is hereby corrected as shown below:

In the Claims

Column 16, Line 18, after "with", delete "the"

Signed and Sealed this
Seventh Day of March, 2023

Katherine Kelly Vidal
*Director of the United States Patent and Trademark Office*